US011898257B1

(12) United States Patent
Tang et al.

(10) Patent No.: US 11,898,257 B1
(45) Date of Patent: Feb. 13, 2024

(54) CARBON COATED ELECTRODES

(71) Applicant: Nanofilm Technologies International Limited, Singapore (SG)

(72) Inventors: Zhi Tang, Shanghai (CN); Ting Wang, Singapore (SG); Xu Shi, Singapore (SG)

(73) Assignee: Nanofilm Technologies International Limited, Singapore (SG)

(*) Notice: Subject to any disclaimer, the term of this patent is extended or adjusted under 35 U.S.C. 154(b) by 0 days.

(21) Appl. No.: 18/264,610

(22) PCT Filed: Jan. 20, 2023

(86) PCT No.: PCT/EP2023/051373
§ 371 (c)(1),
(2) Date: Aug. 8, 2023

(87) PCT Pub. No.: WO2023/139214
PCT Pub. Date: Jul. 27, 2023

(30) Foreign Application Priority Data

Jan. 20, 2022 (WO) ................ PCT/CN2022/000008
Feb. 25, 2022 (EP) ..................................... 22157354

(51) Int. Cl.
*C25B 11/04* (2021.01)
*C25B 11/036* (2021.01)
(Continued)

(52) U.S. Cl.
CPC .............. *C25B 11/04* (2013.01); *C23C 14/35* (2013.01); *C25B 11/036* (2021.01);
(Continued)

(58) Field of Classification Search
None
See application file for complete search history.

(56) References Cited

U.S. PATENT DOCUMENTS

2022/0042178 A1   2/2022  Shi et al.
2022/0275498 A1*  9/2022  Becker ................ C23C 14/5886
(Continued)

FOREIGN PATENT DOCUMENTS

CN            115312798 A  * 11/2022
WO    WO 2022/013317 A1     1/2022

OTHER PUBLICATIONS

Zhang Weixin et al., "Strategy of alternating bias voltage on corrosion resistance and interfacial conductivity enhancement of TiCx/a-C coatings on metallic bipolar plates in PEMFCs," *Energy* 162:933-943, Elsevier (2018).
(Continued)

*Primary Examiner* — Jonathan Crepeau
(74) *Attorney, Agent, or Firm* — Sterne, Kessler, Goldstein & Fox P.L.L.C.

(57) ABSTRACT

An electrode for electrochemical applications is coated with a layer of a-C, wherein the layer of a-C comprises at least 10 each of first and second sub-layers, being—(i) first sub-layers having high conductivity with a sp2 content of 60-95%, alternating with—(ii) second sub-layers having high corrosion resistance with a sp2 content of 50-90%, wherein the sp2 content of the first sub-layers is at least 3% greater than the sp2 content of the second sub-layers. A method of making such electrodes comprises: —a) depositing a first sub-layer comprising a-C, —b) depositing a second sub-layer comprising a-C wherein the sp2 content of the first sub-layer is at least 3% greater than the sp2 content of the second sub-layer, and—c) repeating the steps above to deposit at least 10 first sub-layers alternating with 10 second sub-layers, so as to produce the electrodes.

21 Claims, 2 Drawing Sheets

(51) Int. Cl.
*C23C 14/35* (2006.01)
*H01M 8/0213* (2016.01)
*H01M 8/0228* (2016.01)
*H01M 4/86* (2006.01)
*H01M 8/10* (2016.01)

(52) U.S. Cl.
CPC ....... *H01M 8/0213* (2013.01); *H01M 8/0228* (2013.01); *H01M 2004/8694* (2013.01); *H01M 2008/1095* (2013.01)

(56) References Cited

U.S. PATENT DOCUMENTS

2022/0384820 A1* 12/2022 Jacobs ................ H01M 4/8663
2022/0396746 A1* 12/2022 Okazaki ................ C23C 28/044

OTHER PUBLICATIONS

International Search Report and Written Opinion for International Application No. PCT/EP2023/051373, European Patent Office, Rijswijk, The Netherlands, 14 pages, dated Jun. 1, 2023.

* cited by examiner

Fig. 1

Fig. 2

CARBON COATED ELECTRODES

INTRODUCTION

The present invention relates to electrode plates, including plates for electrolysis applications and bipolar plates for use in hydrogen fuel cells (in particular PEM fuel cells), coated with a carbon-containing coating, and to methods of manufacture and use of the plates. The carbon-coated plates possess good conductivity and corrosion resistance and offer a more economical alternative e.g. to gold coated bipolar plates.

BACKGROUND TO THE INVENTION

Amorphous carbon is a free, reactive form of carbon which does not have a crystalline form. Various forms of amorphous carbon films exist and these are usually categorised by the hydrogen content of the film and the $sp^2:sp^3$ ratio of the carbon atoms in the film.

In an example of the literature in this field, amorphous carbon films are categorised into 7 categories (see table below taken from "Name Index of Carbon Coatings" from Fraunhofer Institut Schicht-und Oberflächentechnik):

| Amorphous Carbon Films | | | | | | |
|---|---|---|---|---|---|---|
| Hydrogen-Free | | | Hydrogenated | | | |
| Unmodified | | Modified With metals | Unmodified | | Modified with Metals | Non-metals |
| $sp^2$ | $sp^3$ | $sp^2$ | $sp^2$ or $sp^3$ | $sp^3$ | $sp^2$ | $sp^2$ |
| Hydrogen-free amorphous carbon | Tetrahedral, hydrogen-free amorphous carbon | Metal-containing, hydrogen-free amorphous carbon | Hydrogenated amorphous carbon | Tetrahedral, hydrogenated amorphous carbon | Metal-containing, hydrogenated amorphous carbon | Non-metal containing hydrogenated amorphous carbon |
| a-C | ta-C | a-C:Me | a-C:H | ta-C:H | a-C:H:Me | a-C:H:X |

Amorphous and tetrahedral amorphous carbon (a-C and ta-C) are characterised in that they contain little or no hydrogen (less than 10% mol, generally less than 5% mol, typically less than 2% mol).

Tetrahedral hydrogen-free amorphous carbon (ta-C) is further characterised in that it contains a high content of $sp^3$ hybridised carbon atoms (typically greater than 80% of the carbon atoms being in the $sp^3$ state).

Tetrahedral amorphous carbon coatings have high hardness and low friction coefficient, and are excellent wear-resistant coatings. At the same time, the ta-C and also a-C can maintain its stability over long time periods in harsh environments (such as acidic or alkaline conditions) and therefore has broad prospects in the development of anti-corrosion applications.

An increasing awareness of the effects of climate change has led to an increase in research on alternative "fossil free" energy sources, such as hydrogen. Hydrogen fuel cells containing electrodes have been developed that produce electrical power through an electrochemical oxidation of hydrogen to form water. Hydrogen is in turn generated from water electrolytically, using similar electrodes.

A widely used hydrogen fuel cell is the proton exchange membrane (PEM) fuel cell which comprises a semipermeable membrane which permits protons to pass through the membrane while acting as a barrier to electrons and reactants (e.g. hydrogen and oxygen gas). Adjacent PEM cells are connected by bipolar plates which conduct electricity from one PEM cell to an adjacent PEM cell.

Bipolar plates tend to be formed from metals, due to their reactivity towards acids, and coated with corrosion resistant coatings. A commonly used coating for metallic bipolar plates is gold. However, the gold coating processes significantly increases the cost of the bipolar plate. Also, any corrosion resistant coating can compromise plate conductivity.

Similarly, other electrode plates, such as electrolysis electrodes, are made from metals and alloys. Known electrodes for hydrogen generation can also be coated with corrosion resistant coatings; again, known coatings designed for corrosion resistance can limit conductivity and hence electrode performance.

Li et al. 2014 (International Journal of Hydrogen Energy, 39(16): 8421-8430) discloses aluminium bipolar plates with coatings of TiN, CrN, C, C/TiN, C/CrN and an a-C top layer. WO 2013/124690 discloses plates made of steel, aluminium or titanium, a TiN, CrN, ZrN, TiC or TiCN layer, and a non-hydrogenated amorphous carbon layer. WO 01/28019 discloses an aluminium bipolar plate, coated with a first layer including Ti, a second layer including TiAlN and a hydrophobic graphite outer layer. EP 3 670 696 discloses a steel substrate, coated with a seed layer, a barrier layer comprising DLC and deposited by CVD, and a ta-C layer deposited by CVA. This document does not disclose the use of this coated substrate as a bipolar plate. CN 106 374 116 discloses a stainless steel bipolar plate with a high entropy alloy primer layer, a high entropy alloy—carbon mixed transition layer and an outer amorphous carbon layer. EP 3650 582 discloses a multi-layer coating comprising in order, an SiC seed layer, a thermally insulating layer (e.g. AlN, Si Si3N4, Al2O3), an interfacial layer and one or more layers of ta-C. This document does not disclose the use of this coating on a bipolar plate. CN 109 560 290 discloses a bipolar plate (e.g. of steel) with a conducting coating (metal oxide e.g. ITO), an anticorrosion coating (e.g. Cr or Ti) and an a-C top coat. CN 110 783 594 discloses a stainless steel bipolar plate coated with an Ni layer, a graphene layer and an amorphous carbon outer layer.

US 20220042178 discloses corrosion resistant carbon coatings and methods for producing such coatings and WO 2022013317 discloses carbon coated bipolar plates for use in hydrogen fuel cells. Zhang et al. (Energy, vol. 162, pp 933-943) discloses TiCx/a-C coatings on fuel cell bipolar plates having enhanced corrosion resistance and interfacial conductivity as a result of alternating bias voltage during magnetron sputtering. In addition, Lacerda et al 1998 (Appl. Phys. Lett., 73: 617; https://doi.org/10.1063/1.121874) and Ahmad et al. 2005 (Thin Solid Films, 482:45-49) both disclose the effect of varying substrate bias on the sp2/sp3 content of the sputtered carbon films, respectively.

A common problem with coated electrodes e.g. as described in the referenced prior art is thus that a coating designed with one particular property, e.g. high conductivity, meeting a given performance criterion, can have compromised performance in another property, e.g. corrosion resistance (or vice versa).

There therefore exists the need for alternative electrodes which exhibit a combination of good conductivity and corrosion resistant properties.

In an earlier unpublished application, we have described electrodes, including bipolar plates for hydrogen fuel cells coated with amorphous carbon (a-C).

Herein, we describe alternative electrodes, preferably improvements with respect to known electrodes, and method for manufacture thereof.

SUMMARY OF INVENTION

The present invention provides electrodes (e.g. plates) for use in electrochemical applications coated with amorphous carbon (a-C). In preferred embodiments, the invention provides bipolar plates for use in hydrogen fuel cells (in particular PEM fuel cells) coated with amorphous carbon (a-C) and electrodes for hydrogen generation coated with amorphous carbon (a-C).

Electrodes of the invention have been shown to exhibit a favourable combination of conductivity and corrosion resistance, and electrodes of specific embodiments have been shown to have favourable properties of low ion leaching, low interfacial contact resistance (ICR), low corrosion current density and high conductivity. They are consequently especially suitable for use in PEM fuel cells.

Accordingly, the invention provides an electrode for a fuel cell or for electrolysis, being in preferred embodiments a bipolar plate for a PEM hydrogen fuel cell or a hydrogen generating electrode; the electrode is coated with a carbon-containing coating, wherein the carbon-containing coating comprises a-C. Preferably, the coating comprises a layer which consists of a-C and typically this layer is the uppermost or outer layer of the coating (i.e. the layer of the coating exposed to the atmosphere).

In particular, the invention provides an electrode, coated with a layer of a-C, wherein the layer of a-C comprises at least 10 each of first and second sub-layers, being
  (i) first sub-layers having high conductivity with a sp2 content of 60-95%, alternating with
  (ii) second sub-layers having high corrosion resistance, with a sp2 content of 50-90%,
  wherein the sp2 content of the first sub-layers is at least 3% greater than the sp2 content of the second sub-layers.

The coating thus comprises multiple first and second sub-layers and may further comprise non-a-C-containing layers, which increase the corrosion resistance of the coating and/or improve adhesion of the a-C-containing layer to the underlying substrate.

Accordingly, the invention also provides an electrode, e.g. a bipolar plate for a PEM hydrogen fuel cell, coated with a carbon-containing coating, the carbon-containing coating comprising in order:

a) a seed layer comprising a metal or metal alloy;
  b) an interfacial layer comprising a carbide and/or nitride and/or oxide of the metal or alloy in the seed layer; and
  c) a top layer comprising a-C made up of the multiple first and second sub-layers of the invention.

The invention also provides a method of coating an electrode, e.g. a bipolar plate for a PEM hydrogen fuel cell, with a carbon-containing coating, the method comprising:
  a) applying onto the plate a seed layer comprising a metal or an alloy;
  b) applying onto the seed layer an interfacial layer comprising a nitride and/or carbide and/or oxide of the seed layer metal or alloy; and
  c) applying onto the interfacial layer a functional layer comprising a-C made up of the multiple first and second sub-layers of the invention.

In particular, the invention provides a method of coating an electrode, e.g. a bipolar plate for a PEM hydrogen fuel cell, with a carbon-containing coating, the method comprising:
  a) depositing a first sub-layer comprising a-C and having a sp2 content of 65-90% and a sp3 content of 10-35%,
  b) depositing a second sub-layer comprising a-C and having a sp2 content of 45-80% and a sp3 content of 20-55%, and
  c) repeating the steps above to deposit at least 10 first sub-layers alternating with 10 second sub-layers.

The multi-layer structure is believed to be clear though for the avoidance of any doubt a higher sp2 first sub-layer is followed in the coating by a lower sp2 second sub-layer and then in turn by another first sub-layer, etc. The first and second sub-layers may alternate through the overall a-C layer with no other sub-layers between them or may alternate with further optional intermediate sub-layers. Whether further intermediate sub-layers are present or not, a first sub-layer is not adjacent another first sub-layer and a second sub-layer is not adjacent another second sub-layer.

Advantages of the electrodes of the invention include the combination of conductivity and corrosion resistance and may in embodiments include one or more or all of improved corrosion resistance, improved conductivity, reduced leaching of electrode material (e.g. reduced ion leaching) and lower costs compared with conventional gold coated bipolar plates.

Details of the Invention

The invention advantageously provides electrodes for electrochemical applications having coatings that include an amorphous carbon layer and, optionally, other layers deposited as described herein. The invention provides electrodes with coatings that are suitably hard and have high wear resistance in use, and good conductivity and corrosion resistance.

The electrodes may be bipolar plates; accordingly, the invention provides a bipolar plate for a PEM hydrogen fuel cell coated with a carbon-containing coating, wherein the carbon-containing coating comprises or consists of a-C, said a-C comprising or consisting of the multiple first and second sub-layers of the invention.

The electrodes may be electrolysis electrodes; accordingly, the invention provides an electrolysis electrode coated with a carbon-containing coating, wherein the carbon-containing coating comprises or consists of a-C, said a-C comprising or consisting of the multiple first and second sub-layers of the invention.

Preferably, the coating comprises a layer which consists of a-C and typically this layer is the uppermost layer of the coating (i.e. the layer of the coating exposed to the atmosphere).

As noted above, particular embodiments of the invention provide an electrode, e.g. a bipolar plate for a PEM hydrogen fuel cell, coated with a layer of a-C, wherein the layer of a-C comprises at least 10 each of first and second sub-layers, being
  (i) first sub-layers having high conductivity, alternating with
  (ii) second sub-layers having high corrosion resistance.

The respective first and second sub-layers can be distinguished based on their sp2 content. The coating is hence not homogenous. A coating of the invention may have an average sp2 content of, say, 74% across a coating depth in the hundreds of nanometres scale and be made up of multiple first and second sub-layers in the nanometres scale having, respectively sp2 content of 78% and 70%, giving the overall coating an average sp2 content of 74%. As described elsewhere herein these particular values differ for different embodiments of the invention. The sp2% of any individual layer is determined by the parameters of the deposition method at the time.

In embodiments of the invention, the layer of a-C comprises at least 10 each of first and second sub-layers, or preferably at least 20 each of first and second sub-layers, or more preferably at least 50 each of first and second sub-layers, or at least 75 of each of the first and second sub-layers, or at least 100 of each of the first and second sub-layers. Reference herein to a multi-layer coating is intended to refer to a coating comprising these multiple, alternating sub-layers, (i) a first sub-layer having higher conductivity and (ii) a second sub-layer having higher corrosion resistance. The term "first sub-layer" or "layer with higher conductivity" or similar refers to a layer in the coating with higher conductivity than an immediately adjacent sub-layer. Likewise, the term "second sub-layer" or "sub-layer with higher corrosion resistance" or similar refers to a layer in the coating with higher corrosion resistance (e.g. lower corrosion current density, $I_{corr}$) than an immediately adjacent sub-layer. In the discussion above, the first sub-layer with sp2 content of 78% is the layer with higher conductivity and the second layer with sp2 content of 70% is the layer with higher corrosion resistance. The sp2% difference of the sub-layers may not appear large but resultant multi-layer coatings of the invention can have better conductivity and better corrosion resistance performance than a homogenous layer coating with the same average sp2%.

On average, the first sub-layers typically have a higher proportion of sp2 hybridized carbon atoms than the second sub-layers. A first sub-layer typically has a higher proportion of sp2 hybridized carbon atoms than the adjacent second-sub layers. Optionally, the difference in the percentage of sp2 hybridized carbon atoms between the first and second sub-layers is at least 3%, or at least 4%, typically at least 5%, or at least 10%. Optionally, the difference in the percentage of sp2 hybridized carbon atoms between the first and second sub-layers is not more than 40%, typically less than 30%, or less than 20%.

For the avoidance of doubt, a difference of n % (say 3%) in the percentage of sp2 hybridized carbon atoms between the first and second sublayer refers to a sp2 content of n (3) percentage points lower. For example, for a coating with a first sub-layer having a sp2 content of 60%, a second sub-layer having 3% lower sp2 would have a sp2 content of 57% or less.

The first sub-layers suitably have a sp2 content of 60% or more, typically up to 95%. The sp2 content may be 70% or more or preferably 75% or more. The sp2 content may be 90% or less, preferably 85% or less. Also optionally, the sp2 content of the first sub-layers is at least 3% greater than the sp2 content of the second sub-layers, optionally at least 7% greater, optionally at least 10% greater, and the sp3 content of the first sub-layers is at least 3% less, optionally at least 7% less, optionally at least 10% less, than the sp3 content of the second sub-layers.

The second sub-layers suitably have a sp2 content of 40% or more, generally 50% or more, typically up to 90%. The sp2 content may be 55% or more or preferably 60% or more. The sp2 content may be 85% or less, preferably 80% or less. Also optionally, the sp2 content of the second sub-layers is at least 3% less than the sp2 content of the first sub-layers, optionally at least 7% less and optionally at least 10% less, and the sp3 content of the second sub-layers is at least 3% more than the sp3 content of the first sub-layers, optionally at least 7% more and optionally at least 10% more.

Also optionally, the sp2 content of the first sub-layers is not more than 40% greater, more suitably not more than 20% greater, than the sp2 content of the second sub-layers, and the sp3 content of the first sub-layers is not more than 40% less, more suitably not more than 20% less, than the sp3 content of the second-sub layers.

The sp2 content of the coating as a whole (i.e. the average sp2 content of the individual sub-layers) is suitably at least 55%, typically at least 60%. The overall sp2 content of the coating is preferably more than 70% and more preferably more than 75%. Optionally, the overall sp2 content of the coating is generally less than 95%, or less than 90%. Typically, the overall sp2 content is less than 85%.

Specific embodiments of the invention are shown in the Table in the examples below, with reference only to the a-C component of the coating.

In preferred embodiments, bipolar plates of the invention comprise an a-C layer made up of multiple first sub-layers having a sp2 content of 60-95% and multiple second sub-layers having a sp2 content of 40-90%. As will be appreciated, while both sp2 content and sp3 content are often recited, in a-C and ta-C coatings of the invention the sum of sp2 and sp3 content is generally 100% or very close to 100%, meaning at least 98%—the sp3 content can be worked out as the remainder after taking into account the sp2 content, and vice versa.

Within the a-C layer there are multiple first and second sub-layers, and these sub-layers are very thin. As described in more detail below, the total a-C thickness may be 3.0 µm or less, 1.0 µm or less. Preferably the total a-C thickness may be 0.5 µm or less, or more preferably 0.3 µm or less. Within that layer the sub-layers are much thinner. The sub-layers each have thicknesses generally up to 20 nm, typically up to 5 nm, more typically up to 3 nm, preferably up to 2 nm, more preferably up to 1.5 nm and in examples below had thicknesses of about 1 nm. The sub-layers each have thicknesses typically 0.2 nm or greater, more typically 0.3 nm or greater, preferably 0.5 nm or greater, more preferably 0.8 nm or greater. Sub-layer thicknesses may be in the range 0.3 to 3 nm or preferably in the range 0.5 to 2 nm. As will be appreciated, the thinner the layers the more layers can be included in a a-C layer of given overall thickness. The overall layer may comprise at least 20 of each of the alternate first and second sub-layers (40 sub-layers in total), at least 30 of each of the alternate first and second sub-layers. Preferably the overall layer will comprise at least 50 of each of the alternate first and second sub-layers, or more preferably at least 80 of each alternating first and second sub-layers. Coatings of the invention on bipolar plates have been made with 100 or more of each sub-layer, deposited alternately. In an example below there were 140 of each of the first and second sub-layers. The number of layers can be known accurately when depositing layers using periodically changing substrate bias or duty cycle as the number of periodic cycles is known, and there is one per sub-layer.

In a bipolar plate of a particular embodiment,
the layer of a-C comprises at least 30 of each of the alternate first and second sub-layers,
the sub-layers each have thicknesses of about 0.8-1.3 nm,
the first sub-layers have a sp2 content of 70-85% and a sp3 content of 15-30%,
the second sub-layers have a sp2 content of 60-80% and a sp3 content of 20-40%, and
optionally, the sp2% differs by at least 3% between the first and second sub-layers.

In a bipolar plate of a further particular embodiment,
the layer of a-C comprises at least 80 of each of the alternate first and second sub-layers,
the sub-layers each have thicknesses of about 1 nm, the first sub-layers have a sp2 content of 70-85% and a sp3 content of 15-30%,
the second sub-layers have a sp2 content of 60-80% and a sp3 content of 20-40%, and
optionally, the sp2% differs by about 4% between the first and second sub-layers.

The coatings may also comprise one or more additional layers between the substrate and the a-C containing layer, wherein the one or more additional layers improve adhesion of the a-C layer to the substrate and/or impart further corrosion resistant properties to the coating.

The coating on the electrode typically comprises a seed layer, this is coated onto the substrate, which is typically metallic.

The coating typically also comprises an interfacial layer between the seed layer and the a-C—containing layer (also referred to as the top or uppermost layer).

The substrate may also be formed of other materials from which electrodes are typically made, including carbon materials (such as graphite) and composite materials (such as a graphite or composite plate). When the substrate is metallic, the substrate may be formed of a single metal (e.g. titanium or aluminium) or be formed from an alloy (e.g. an alloy of iron, titanium or aluminium). The metallic substrate is preferably a steel substrate, preferably stainless steel, such as a 304 or 316L stainless steel substrate, which is commonly used in the manufacture of bipolar plates for PEM cells. Other metals and alloys and steels are also suitable.

The size (thickness) of the metallic substrate will of course depend on the size of the electrode, e.g. PEM cell and the intended application(s) of the PEM cell. For bipolar plates the metallic substrate will typically have a thickness of 0.5 mm or less, for example 0.3 mm or less, preferable 0.2 mm or less (such as approximately 0.1 mm).

The metallic substrate can comprise channels on its surface, which may be formed by stamping or etching. These channels allow for the transfer of coolants or reagents, e.g. between adjacent bipolar plates.

As described above, suitable substrates on which coatings of the invention can be applied are electrodes and plates for use in electrochemical applications. Coatings of the invention are suitable for use on bipolar plates or electrodes for use in electrolysis, for example for use as an anode (e.g. for hydrogen generation) or as an anode or cathode where oxygen is not released.

In preferred embodiments, a seed layer is deposited on the metallic substrate. The seed layer serves to promote adhesion between the metallic substrate and the interfacial layer and may also exhibit some corrosion resistant properties.

The seed layer comprises (and preferably consists of) a metal or an alloy. Suitably the seed layer comprises or consists of a metal selected from, but not limited to, the list containing Ti, Nb, Zr, Mo, W, Ta, V, Hf, Cr, Ni and Al or comprises or consists of an alloy thereof. The seed layer may also comprise or consist of a compound of one of the metals or alloys with oxygen, nitrogen or carbon, i.e. the oxide, nitride or carbide of the metal or alloy.

Preferably for the seed layer, the metal/alloy is selected from chromium, titanium, alloys of chromium and alloys of titanium. Even more preferably, the metal in the seed layer is or comprises titanium.

The seed layer typically has a thickness of 1 μm or less, typically 0.5 μm or less, suitably 0.4 μm or less, preferably 0.3 μm or less or 0.2 μm or less. In addition, the seed layer is usually 0.01 μm or thicker, 0.03 μm or thicker, 0.05 μm or thicker. In a specific example, described below, the seed layer was approximately 0.06 μm.

As mentioned above, the seed layer may impart some corrosion resistant properties to the overall coating and therefore deposition of the seed layer should ensure that as much of the substrate is covered as possible. The seed layer is preferably deposited so as to be high density. The seed layer may therefore be deposited using a variety of plasma vapour deposition or chemical vapour deposition techniques. Preferably, the seed layer is deposited by FCVA (Filtered Cathodic Vacuum Arc) or multi-arc deposition or sputtering, e.g. using magnetron sputtering (including high-power impulse magnetron sputtering as this promotes dense coatings).

The seed layer typically contains very few impurities (i.e. the seed layer is typically very pure); for example the impurity content in the seed layer may be 10% or less, typically 5% or less, preferably 2% or less (for example 1% or less). An impurity as mentioned herein refers to any substance other than that which is intended to make up the seed layer. For example, if the seed layer consists of Ti, then any element other than Ti present in the seed layer can be considered an impurity.

The interfacial layer when present promotes adhesion of the a-C containing layer (made up of its multiple sub-layers) to the seed layer. As for the seed layer, the interfacial layer may also increase the corrosion resistance of the coating. In addition, the interfacial layer may have a role in reducing the contact resistance of the electrode/substrate. Preferably, the interfacial layer is of a relatively low density (compared to the seed layer and a-C-containing layer) and exhibits pinholes or vacated columnar pockets within the coating. It may be deposited under conditions that promote low density coatings and promote formation of columnar growth within the coating.

In general, the interfacial layer may comprise or consist of a metal selected from, but not limited to, the list containing Ti, Nb, Zr, Mo, W, Ta, V, Hf, Cr, Ni and Al or comprise or consist of an alloy thereof. The interfacial layer may also comprise or consist of a compound of one or more of the metals or alloys with oxygen, nitrogen and/or carbon, i.e. the oxide, nitride and/or carbide of the metal or alloy. Usually, the interfacial layer is different from the seed layer. Preferably there is one element in common between the seed and interfacial layers.

The interfacial layer is generally formed from a carbide and/or nitride of a metal or alloy and usually a carbide and/or nitride of one of the metals of the seed layer of the metal/alloy of the seed layer. For example, when the seed layer is a titanium seed layer, the interfacial layer may comprise or consist of titanium carbide, titanium nitride, or a mixture thereof. Likewise, when the seed layer is a chromium seed layer, the interfacial layer may comprise or consist of chromium carbide, chromium nitride or a mixture thereof. Preferably, when the seed layer comprises or consists of titanium, the interfacial layer comprises or consists of titanium carbide.

The interfacial layer typically has a thickness of 1 μm or less, suitably 0.5 μm or less, preferably 0.3 μm or less. In addition, the interfacial layer is usually 0.005 μm or thicker, generally 0.01 μm or thicker, for example 0.03 μm or thicker. In an example below, the interfacial layer had a thickness of approximately 0.1 μm.

As mentioned above, the interfacial layer may impart some corrosion resistant properties to the overall coating and therefore deposition of the interfacial layer should ensure that as much of the substrate is covered as possible. The interfacial layer may therefore be deposited using a variety of plasma vapour deposition or chemical vapour deposition techniques. Preferably, the interfacial layer is deposited by sputtering, preferably adjusted to give a coating layer with reduced density compared to the seed layer, while maintaining a sufficiently high density.

The interfacial layer typically contains very few impurities (i.e. the interfacial layer is typically very pure); for example the impurity content in the interfacial layer may be 10% or less, typically 5% or less, preferably 2% or less (for example 1% or less). For example, if the seed layer consists of titanium nitride, then any element other than Ti or N present in the interfacial layer can be considered an impurity.

Accordingly, the carbon-containing coating may comprise in order:
a) a seed layer comprising a metal or alloy;
b) an interfacial layer comprising a carbide and/or nitride and/or oxide of the metal/alloy in the seed layer; and
c) a top layer comprising a-C (as multiple sub-layers).

The uppermost layer of the coating (i.e. the layer exposed to the atmosphere) is the a-C-containing layer. The layer may comprise greater than 70%, for example greater than 80%, preferably greater than 90% a-C by weight or the layer may consist of a-C.

As discussed above, the term "amorphous carbon" (a-C) as used herein refers to sp2-containing amorphous carbon having a low hydrogen content. For example, the a-C may have a hydrogen content of 10% or less, typically 5% or less, preferably 2% or less (for example 1% or less). The a-C sub-layers are suitably deposited by FCVA. The a-C sub-layers are generally substantially hydrogen free. The percentage content of hydrogen provided here refers to the molar percentage (rather than the percentage of hydrogen by mass).

Additionally, it is preferred that the a-C has a low nitrogen content. For example, the a-C may have a nitrogen content of 10% or less, typically 5% or less, preferably 2% or less (for example 1% or less). The percentage content of nitrogen provided here refers to the molar percentage (rather than the percentage of nitrogen by mass). When a-C is deposited using FCVA the nitrogen content is usually substantially none apart from a minimum amount as a result of gas remaining in the chamber after deposition of the interfacial layer (if present).

It is also preferred that the a-C has a low oxygen content. For example, the a-C may have an oxygen content of 5% or less, typically 2% or less, preferably 1% or less. The percentage content of oxygen provided here refers to the molar percentage (rather than the percentage of oxygen by mass). When a-C is deposited using FCVA the oxygen content is usually substantially none apart from a minimum amount as a result of gas remaining in the chamber after deposition of the interfacial layer (if present).

Sp2 and sp3 content of the sub-layers is discussed in detail elsewhere. It is noted that the sp2 and sp3 content may vary throughout a given sub-layer of the a-C layer. The values provided above are intended as an average of the sp2 and sp3 content in the sub-layer.

Ta—C is a dense amorphous material described as composed of disordered sp3, interlinked by strong bonds, similar to those that exist in disordered diamond (see Neuville S, "New application perspective for tetrahedral amorphous carbon coatings", QScience Connect 2014:8, http://dx.doi.org/10.5339/connect.2014.8). Due to its structural similarity with diamond, ta-C is a very hard material with hardness values often greater than 30 GPa.

Ta—C coatings are typically hard and dense. For the present invention hardness at exceptionally high levels may not be necessary, and sp2 content is needed to retain acceptable conductivity; hence, sp3 content even in the more sp3-property sub-layers (i.e. the second sub-layer having high corrosion resistance) is not so high for the sub-layer to be regarded as truly or purely ta-C. Typically, the second layer has greater than 50% sp2 content as described above, and therefore the second layer is also closer to being an sp2 layer than an sp3 layer despite having lower sp2 content than the first sub-layer. Coatings/layers of a-C provide adequate hardness while retaining suitable conductivity. The coating hardness of specific embodiments, described below, was approximately 987HV and 1171 HV and produced good results. In general, while a-C/ta-C deposition processes can be adjusted to produce coatings of varying—including of extremely high—hardness, coatings for the present invention do not need to have overly high hardness. Relatively low $sp^3$ content, as described above normally correlates with lower hardness values. Substrates, in this case electrodes or bipolar plates, may suitably have an a-C coating with a hardness of at least 650 HV or at least 700HV. Hardness may be in the range 700HV-1500HV, suitably in the range 800HV-1400HV, preferably in the range 800HV-1200HV. Coatings with a range of measured hardness values within these ranges are believed suitable, and for slightly different end applications, according sometimes to user choice, different hardness may be appropriate.

Hardness is suitably measured using the Vickers hardness test (developed in 1921 by Robert L. Smith and George E. Sandland at Vickers Ltd; see also ASTM E384-17 for standard test), which can be used for all metals and has one of the widest scales among hardness tests. The unit of hardness given by the test is known as the Vickers Pyramid Number (HV) and can be converted into units of pascals (GPa). The hardness number is determined by the surface area of the indentation which is tested by a certain load. As examples, Martensite a hard form of steel has HV of around 1000 and diamond can have a HV of around 10,000 HV (around 98 GPa). Hardness of diamond can vary according to precise crystal structure and orientation but hardness of from about 90 to in excess of 100 GPa is common.

The a-C is optionally doped with other materials (either metals or non-metals).

The a-C coating is also preferably free or substantially free of neutral carbon atoms or particles.

The a-C-containing layer overall, made up of multiple first and second sub-layers, typically has a density of greater than 2.0 g/cm$^3$, for example greater than 2.5 g/cm$^3$, or preferably greater than 2.7 g/cm$^3$. The a-C-containing layer overall, made up of multiple first and second sub-layers, typically has a density of up to 4.0 g/cm$^3$, for example up to 3.5 g/cm$^3$, or preferably up to 3.2 g/cm$^3$. This density is high compared with conventional DLC films or other films with a high sp2 content. This density level is a result of the sp3 carbon-carbon bonds within the coating being very small (even as low as 1-2 angstroms). With this structure, other atoms, especially iron, cannot pass through and therefore the structure prevents iron ion leaching and corrosion. Depositing multiple layers, some with more sp2 nature and some with more sp3 nature (relatively speaking) and keeping the layers thin to avoid or reduce formation of crystalline areas within the overall layer, enables retention of a combination of the favourable conductivity properties of the sp2 bonds and also the higher density of the sp3 bonds.

The multiple sub-layers of the a-C are typically deposited via a cathodic vacuum arc deposition technique, for example a filtered cathodic vacuum arc (FCVA deposition technique). Apparatus and methods for FCVA coatings are known and can be used as part of the methods of the invention. The FCVA coating apparatus typically comprises a vacuum chamber, an anode, a cathode assembly for generating plasma from a target and a power supply for biasing the substrate to a given voltage. The nature of the FCVA including arc current, substrate biasing and varying duty cycle is conventional and not a part of the invention, though the invention does provide a deposition method using FCVA apparatus and periodically varied deposition conditions to obtain the multiple first and second sub-layers of the coatings.

The coated bipolar plates described herein possess good corrosion resistant properties, even with a relatively thin coating thickness. For example, the overall coating thickness (including the a-C-containing layer and when present the seed and interfacial layers) is typically less than 2 μm, suitably less than 1.5 μm and is preferably less than 1 μm.

The coated bipolar plates described herein additionally possess good conductivity. It is important that the coated bipolar plates have both good conductivity and good corrosion resistant properties. Without wishing to be bound by theory, it is believed that alternating first and second sub-layers within the a-C layers leads to improved combination of corrosion resistance and conductivity properties relative to coatings with an a-C layer comprising only a single layer with homogenous sp2 content.

In depositing the layers for electrodes/plates of the invention a number of conventional and commercially available deposition techniques are known. In the above, some embodiments indicate preferred deposition processes. In general, deposition of the seed and interfacial layers herein may be achieved using a process appropriate to the skilled person including but not limited to one or more or a combination of known PVD or CVD methods, including sputtering, magnetron sputtering, high-power impulse magnetron sputtering, multi-arc ion plating, arc deposition, cathode vacuum arc deposition, filtered vacuum arc deposition and plasma enhanced chemical vapour deposition.

The invention also provides method for depositing the a-C layer comprising its sub-layers.

Accordingly, the invention provides a method of coating an electrode, comprising providing an electrode and applying to the electrode a layer of a-C, wherein the layer of a-C comprises at least 10 each of first and second sub-layers, being
(i) first sub-layers having high conductivity, alternating with
(ii) second sub-layers having high corrosion resistance.

Methods of the invention may comprise periodically varying the coating parameters so that a multi-layer coating of distinct first sub-layers and second sub-layers is applied onto the electrode. Methods of the invention preferably involve a continuous deposition process for depositing the a-C layer, i.e. a-C is continuously deposited to form the a-C layer, but the coating parameters are varied such that the coating consists of multiple first and second sub-layers.

Embodiments of methods of the invention comprise providing an electrode and applying to it a carbon-containing coating, the carbon-containing coating comprising in order:
 a) a seed layer comprising a metal or metal alloy;
 b) an interfacial layer comprising a carbide and/or nitride and/or oxide of the metal or alloy in the seed layer; and
 c) a top layer comprising a-C made up of the multiple first and second sub-layers of the invention.

The invention also provides a method of coating an electrode, e.g. a bipolar plate for a PEM hydrogen fuel cell, with a carbon-containing coating, the method comprising:
 a) applying onto the plate a seed layer comprising a metal or an alloy;
 b) applying onto the seed layer an interfacial layer comprising a nitride and/or carbide and/or oxide of the seed layer metal or alloy; and
 c) applying onto the interfacial layer a functional layer comprising a-C made up of the multiple first and second sub-layers of the invention.

A further method of coating a bipolar plate for a PEM hydrogen fuel cell with a carbon-containing coating comprises:
 a) depositing a first sub-layer comprising a-C and having a sp2 content of 60-90% and a sp3 content of 10-40%,
 b) depositing a second sub-layer comprising a-C and having a sp2 content of 45-80% and a sp3 content of 20-55%, and
 c) repeating the steps above to deposit at least 10 first sub-layers alternating with 10 second sub-layers,
wherein the sp2 content of the first sub-layers is optionally at least 3% greater than the sp2 content of the second sub-layers.

Optional and preferred properties of the first and second sub-layers deposited using the methods of the invention are as described elsewhere herein in relation to the coating per se.

The method suitably comprises depositing at least 30 alternating first and second sub-layers, more suitably at least 50 such alternating sub-layers, preferably at least 80.

Alternating between sub-layers can be achieved by varying the deposition parameters. This is suitably done in a single deposition chamber using the same graphite/carbon target or targets. Hence, the method may comprise depositing first sub-layers (e.g. by FCVA) while applying a first biasing regimen to the bipolar plate and depositing second sub-layers (again e.g. by FCVA) while applying a second biasing regimen to the bipolar plate. During the method, the second biasing regimen is adjusted compared to the first so as to result in sp2 content in the a-C being decreased by at least 3% and sp3 content in the a-C being increased by at least 3%. By regimen we refer to one or more deposition parameters such as current, voltage, substrate bias, duty cycle, deposition time and temperature. For a deposition apparatus having a rotating carousel these also include carousel rotation speed and, where present, rotation speed of any rotating substrate holders mounted on the carousel.

Suitably, methods of the invention comprise coating the substrate at a temperature of 25 to 190 degrees C., preferably 100 to 170 degrees C.

Suitably, biasing is held at an approximately constant voltage during deposition of the different sub-layers. The methods preferably then comprise adjusting duty cycle to differentiate between sub-layers. Accordingly, the method may comprise applying a biasing voltage according to a duty cycle, and periodically adjusting the duty cycle, whereby adjusted duty cycle deposits the second-sub-layers having increased sp3 content and decreased sp2 content. Thus, in preferred methods the duty cycle periodically is increased and decreased to deposit the respective sub-layers.

Alternatively, biasing voltage is suitably varied during deposition of the different sub-layers. The methods preferably then comprise adjusting the bias voltage to differentiate between sub-layers. Accordingly, the method may comprise applying a biasing voltage according to a duty cycle, and periodically adjusting the bias voltage to alternately deposit the sub-layers having increased sp3 content and decreased sp2 content and then the sub-layers having decreased sp3 content and increased sp2 content.

Further alternatively, biasing current is suitably varied during deposition of the different sub-layers. The methods preferably then comprise adjusting the bias current to differentiate between sub-layers. Accordingly, the method may comprise applying a biasing current according to a duty cycle, and periodically adjusting the current to alternately deposit the first and second-sub-layers.

In further embodiments, two or more or all of bias voltage, bias current and duty cycle are varied to deposit the respective sub-layers.

In an example described below in more detail, the method comprises mounting the bipolar plate on a rotating carousel within a FCVA deposition chamber, rotating the carousel at approximately constant speed and periodically adjusting the biasing voltage to alternate between depositing the first and the second sub-layers. The time period for operating at respective biasing regimens determines sub-layer thickness and therefore is adjusted to achieve the sub-layer thickness described elsewhere. In the example below bias parameters were changed every 50 seconds, though this will vary according to desired sub-layer thickness and deposition rate for a given FCVA chamber set up, as will be appreciated.

Periodic variation in the deposition parameters can give alternating sub-layers of approximately the same thickness. Deposition parameters can also be varied so that first and second sub-layers have pre-determined and different thicknesses.

Methods of the invention are suitable for depositing the a-C layer, made up of multiple sub-layers according to the other above-described optional and preferred features of the invention.

EXAMPLES

The invention is now illustrated in the following examples.

Example 1—Preparation of a Coated Bipolar Plate

A 316L stainless steel bipolar plate was coated as follows.
Step 1) Sample Preparation.

The bipolar plate was cleaned according to the following process:
  a. A weak alkaline solution was used for ultrasonic cleaning to remove oil stains on the surface and in the flow channels.
  b. An acidic acid solution was used to remove the oxide layer and any rust on the substrate.
  c. The substrate was rinse with pure water under ultrasonic conditions.
  d. The substrate was then dried under vacuum conditions for 0.5 hours.

Step 2) Sample Coating

Coating equipment: FCVA coating machine that also includes ion etching capabilities and magnetron sputtering sources.

Process:
  a. The cleaned bipolar plate to be coated is placed into the coating chamber and the pressure within the coating chamber is reduced to $5.0 \times 10^{-5}$ Torr (6.6 mPa) and the temperature was increased to 130° C.
  b. Ion beam cleaning takes place (using convention ion beam cleaning methodology).
  c. The pressure within the chamber is reduced further to $2 \times 10^{-5}$ Torr (2.6 mPa), and the Ti seed layer is deposited under magnetron sputtering conditions, for a time period sufficient to deposit a Ti layer having a thickness of 0.06 μm.
  d. After the seed layer has been deposited, deposition of the interfacial layer begins. Acetylene gas is let into the chamber until the vacuum is $4 \times 10^{-3}$ Torr. A TiC interfacial layer is deposited using a sputtering deposition method using a titanium target at a power of 12 kW in the presence of acetylene gas. This deposition step is conducted for a time period sufficient to deposit a TiC layer having a thickness of 0.1 μm.
  e. After the interfacial layer has been deposited, a layer of 0.3 μm of a-C having multiple sub-layers is deposited using filtered cathodic vacuum arc (FCVA) technology with periodic variation of biasing parameters. Deposition parameters and method were as described below.
  f. After deposition is complete, the vacuum chamber is brought to room temperature and pressure and the coated substrate is removed from the coating chamber. The finished coated substrate has the following structure:

Multi sub-layered sp2/sp3 a-C layer (0.3 μm)
TiC interfacial layer (0.1 μm)
Ti seed layer (0.06 μm)
Substrate - 316L stainless steel bipolar plate Step 2(e)—a-C Layer Deposition Bipolar plate substrates were mounted on a rotating carousel inside the FCVA deposition chamber. Arc current and substrate bias were fixed with the substrate bias having a duty cycle switching between sp2 and sp3 bias. Internal chamber temperature was measured at approximately 100 degrees Celsius. Coating continued for 280 sub-layers in total, 140 each of sp2 and sp3 content sub-layers, total thickness approximately 300 nm. Sp2 content of alternating sub-layers was 60-70% (sp2 sub-layers) and 50-40% (sp3 sub-layers) respectively.

Example 2—Coatings 316L steel plates were prepared and given seed and interfacial layers as per Example 1. The following specific coatings were deposited onto individual 316L steel plates (with reference only to the a-C coating component):

| | first sub-layers | | second sub-layers | | Number of repeats of each sub-layer |
|---|---|---|---|---|---|
| Coating | sp2 content | thickness | sp2 content | thickness | (total multi-layer coating thickness) |
| A1 | 78% | 2 nm | 70% | 2 nm | 60 (240 nm = 0.240 µm) |
| A2 | 78% | 1.5 nm | 74% | 1.5 nm | 100 (300 nm = 0.3 µm) |
| B1 | 80% | 1.8 nm | 72% | 1.8 nm | 80 (288 nm = 0.288 µm) |
| B2 | 76% | 1.5 nm | 70% | 2 nm | 70 (245 nm = 0.245 µm) |

Example 3—Testing the Properties of Coatings of the Invention

Coated stainless steel bipolar plates were prepared following the method described above, however in this example the sp2 content of alternating sub-layers was 70-85% (higher sp2 sub-layers) and 60-80% (lower sp2 sub-layers), respectively. The hardness, interfacial contact resistance (ICR) before and after testing* and corrosion current density ($I_{corr}$) of the coated bipolar plates was measured. The results are shown in the table below and are represented graphically in FIGS. 1 and 2.

* The testing conditions were 1.8V vs SHE at 0.1 ppm Fluorine+$H_2SO_4$, pH 3, for 10 hours.

| Sample | Sub-layer | | sp2 sp3 Average % | | Hardness HV | ICR before test $m\Omega \cdot cm^2$ | ICR after test $m\Omega \cdot cm^2$ | Icorr $A \cdot cm^{-2}$ |
|---|---|---|---|---|---|---|---|---|
| | | | | | | Test condition (1.8 V vs SHE) | | |
| 1# | Layer A | Layer A | 78 | 22 | 743 | 2.67 | 5.79 | 1.05E−04 |
| 2 | Layer A | Layer B | 76 | 24 | 987 | 2.92 | 6.39 | 7.35E−05 |
| 3 | Layer A | Layer C | 74 | 26 | 1171 | 3.16 | 6.88 | 9.93E−06 |
| 4# | Layer C | Layer C | 70 | 30 | 1201 | 3.4 | 10.09 | 7.12E−06 |
| 5 | Layer D | Layer E | 79 | 21 | 1000 | 1.7 | 6.31 | 3.75E−06 | coatings 1 and 4 are comparative

The sp2 and sp3 values in the above table are an average for the whole a-C layer of each coating (including any sub-layers present), individual sp2 and sp3 values for each of the sub-layers Layer A, Layer B, Layer C, Layer D and Layer E, are provided in the table below.

| Sub-layer | sp2 % | sp3 % |
|---|---|---|
| Layer A | 78 | 22 |
| Layer B | 74 | 26 |
| Layer C | 70 | 30 |
| Layer D | 85 | 15 |
| Layer E | 75 | 25 |

Samples 1 and 4 comprise a single a-C layer, since the alternating sub-layers are the same. Therefore, samples 1 and 4 are present as comparative examples, being homogenous with constant sp2 levels throughout the whole coating. Samples 2, 3 and 5 comprise coatings of the invention with alternating different first and second sub-layers within the a-C layer.

For sample 2, Layer A is the first sub-layer having high conductivity as a result of the higher sp2 percentage, and Layer B is the second sub-layer having high corrosion resistance as a result of the higher sp3 percentage.

For sample 3, Layer A is the first sub-layer having high conductivity as a result of the higher sp2 percentage, and Layer C is the second sub-layer having corrosion resistance as a result of the higher sp3 percentage.

For sample 5, Layer D is the first sub-layer having high conductivity as a result of the higher sp2 percentage, and Layer E is the second sub-layer having corrosion resistance as a result of the higher sp3 percentage.

The individual thicknesses for each sub layer in samples 2, 3 and 5 are provided in the table below.

| sample | layer | sp2 (%) | Thickness (nm) | Average sp2 (%) |
|---|---|---|---|---|
| 2 | Layer A | 78 | 0.5 | 76 |
| | Layer B | 74 | 0.5 | |
| 3 | Layer A | 78 | 0.5 | 74 |
| | Layer C | 70 | 0.5 | |
| 5 | Layer D | 85 | 0.4 | 79 |
| | Layer E | 75 | 0.6 | |

The total thickness of the multilayer a-C coating is approximately 250 nm for the samples.

Samples 2 and 3 comprise first and second sub-layers each with a thickness of 0.5 nm, therefore the average sp2 content of samples 2 and 3 is the mean average of the two sub-layers.

Sample 5, however, comprises a first sub-layer having a thickness of 0.4 nm and a second sublayer having a thickness of 0.6 nm, therefore the average sp2 content is not equal to the mean average of the two layers, it is in fact slightly lower.

It can be seen from the data that samples 2 and 3 have higher conductivity (lower ICR) and higher corrosion resistance (lower $I_{corr}$) than would be expected for a homogenous coating with the same average sp2 and sp3 values but without alternating sub-layers. This is further demonstrated by the graphs in FIGS. 1 and 2, discussed below.

Sample 5 has even higher conductivity (even lower ICR) than samples 2 and 3. Before the test (1.8V vs SHE at 0.1 ppm Fluorine+H2SO4, pH 3, for 10 hours), the ICR of sample 5 was lower than that of sample 2 or sample 3. After the test, the ICR of sample 5 has increased (as you would expect), but it is still lower than that of sample 3 while it is comparable to sample 2. The corrosion current density of sample 5 is also lower than that of samples 1 to 4, and sample 5 therefore shows the best performance.

Figure 1:
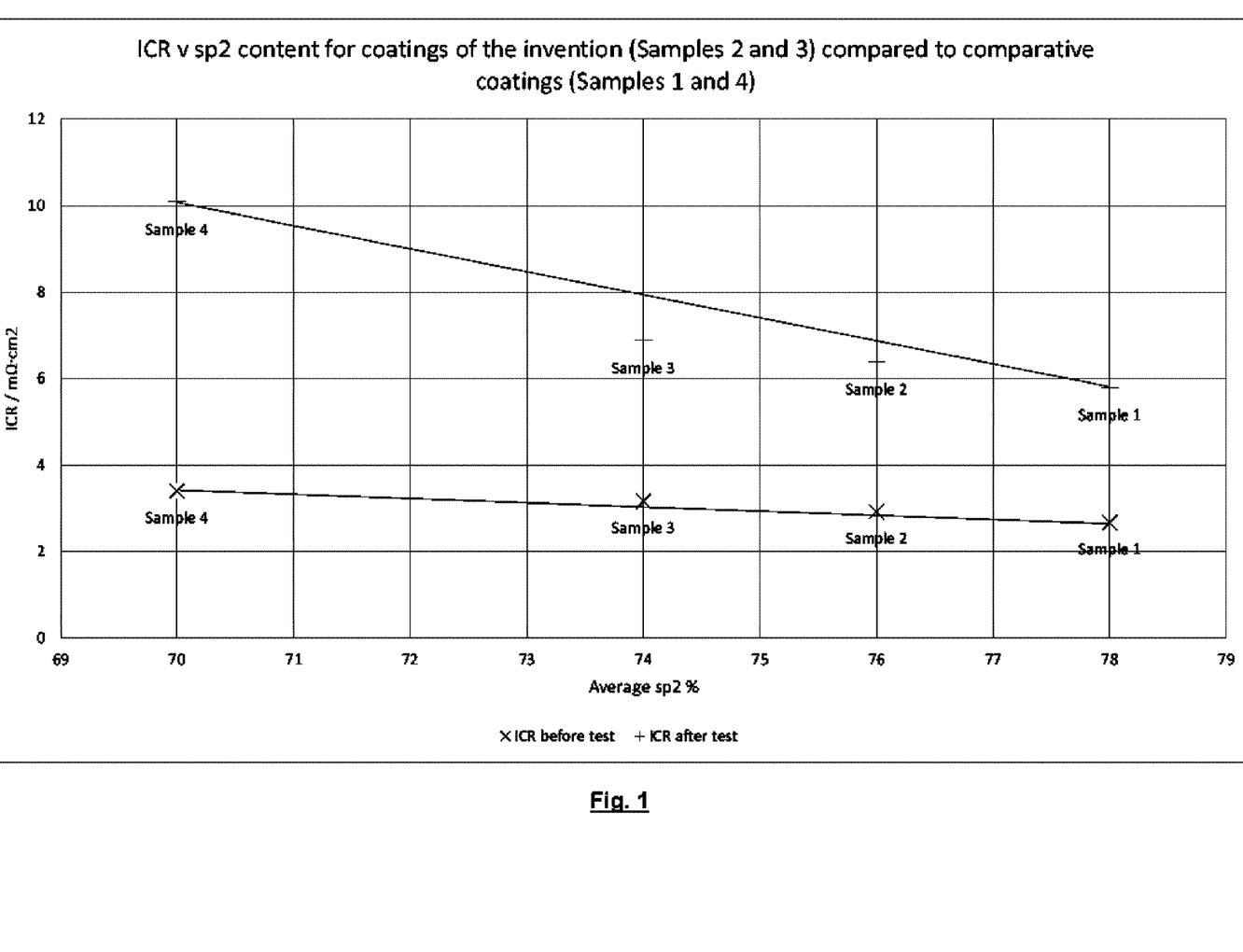
Figure 2:
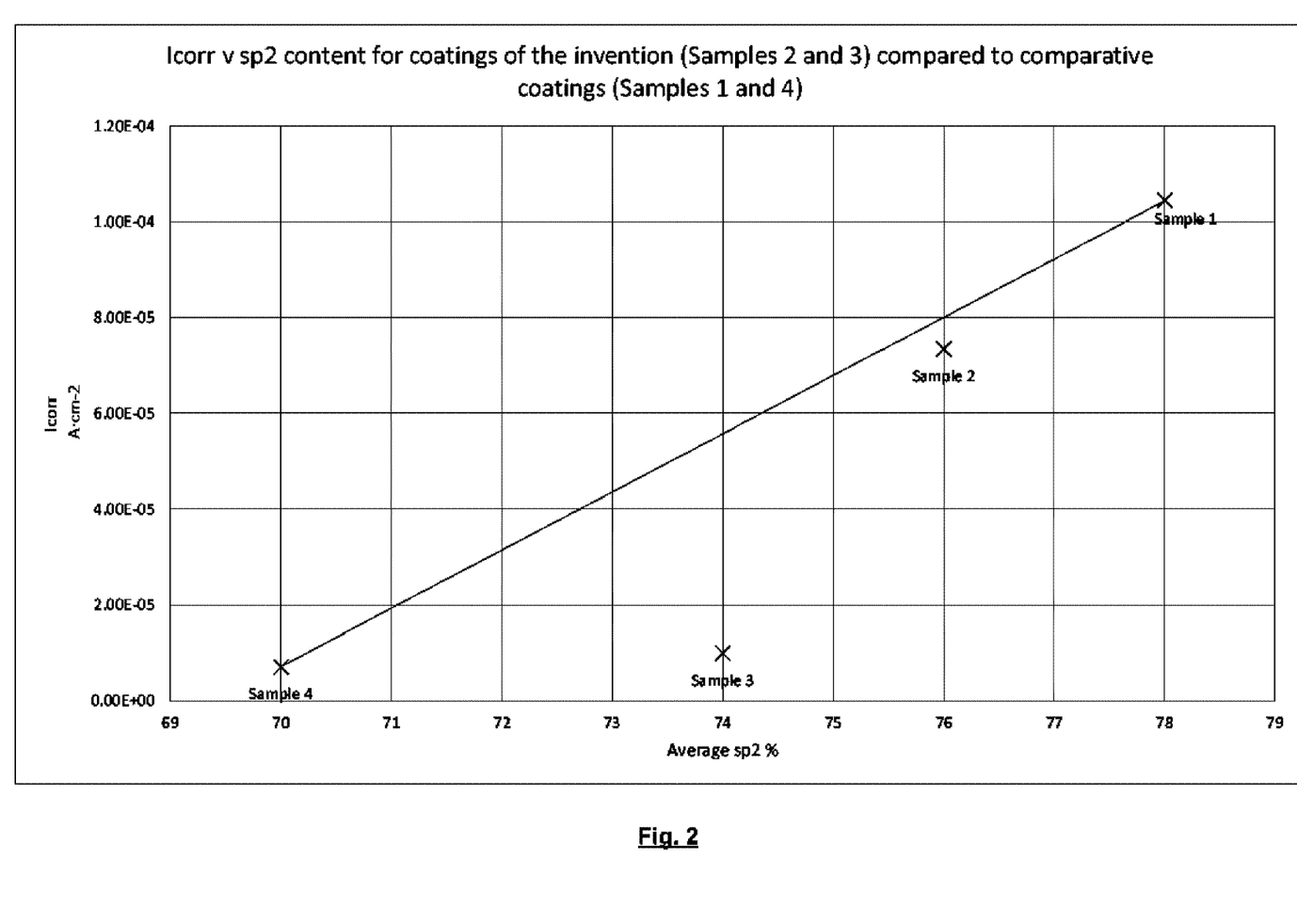

FIG. 1 shows a graph of ICR against sp2 content both before and after testing. A line has been drawn on the graph between comparative samples 1 and 4 for each data set. It is believed that this line demonstrates the expected ICR for a coating with an a-C layer with uniform sp2 content (i.e. without alternating first and second sub-layers). It can be seen that the ICR of samples 2 and 3 is approximately the same as would be expected for a coating of uniform sp2 content before testing, since the data points for samples 2 and 3 are approximately on the line. However, after testing samples 2 and 3 have better ICR than expected, since the ICR for both samples 2 and 3 is significantly below the line, demonstrating lower interfacial contact resistance (and therefore higher conductivity) than expected for a coating without alternating sub-layers. FIG. 1 therefore demonstrates the improved conductivity of bipolar plates coated with coatings of the invention compared to coatings with uniform sp2 content in the a-C layer.

Turning to FIG. 2, again a line has been drawn between comparative samples 1 and 4 to demonstrate the expected $I_{corr}$ for a coating with an a-C layer of uniform sp2 content (i.e. without alternating first and second sub-layers). It is clearly seen in the figure that the $I_{corr}$ of samples 2 and 3 (comprising coatings of the invention), is better than expected, since the data points for these samples are below the expected line. Lower $I_{corr}$ indicates greater corrosion resistance and therefore FIG. 2 demonstrates the improved properties of samples 2 and 3 coated with coatings of the invention, compared to comparative coatings 1 and 4.

Thus, the invention provides plates for use in electrochemical applications (such as electrodes, and bipolar plates for fuel cells), having a-C layers made up of multiple alternating first and second sub-layers, and methods of making the same.

The invention claimed is:

1. An electrode, coated with a layer of a-C, wherein the layer of a-C comprises at least 10 each of first and second sub-layers, being
    (i) first sub-layers having high conductivity with a sp2 content of 60-95%, alternating with
    (ii) second sub-layers having high corrosion resistance with a sp2 content of 50-90%,
    wherein the sp2 content of the first sub-layers is at least 3% greater than the sp2 content of the second sub-layers.

2. The electrode of claim 1, wherein the sp2 content of the first sub-layers is at least 7% greater than the sp2 content of the second sub-layers.

3. The electrode of claim 1, wherein the first sub-layers have a sp2 content of 70-85% and the second sub-layers have a sp2 content of 60-80%.

4. The electrode of claim 1, wherein the sub-layers each have thicknesses up to 5 nm.

5. The electrode of claim 4, wherein the sub-layers each have thicknesses up to 3 nm.

6. The electrode of claim 5, wherein the sub-layers each have thicknesses in the range 0.2 to 2 nm.

7. The electrode of claim 1, wherein the electrode is a bipolar plate for a PEM hydrogen fuel cell.

8. The electrode of claim 1, wherein the electrode is an electrode for hydrogen generation from water.

9. The electrode of claim 1, wherein there are at least 20 each of the first and second sub-layers.

10. A The electrode of claim 1, wherein
    the layer of a-C comprises at least 30 of each of the alternating first and second sub-layers, the sub-layers each have thicknesses of about 0.8-2 nm,
    the first sub-layers have a sp2 content of 70-85% and a sp3 content of 15-30%, and
    the second sub-layers have a sp2 content of 65-80% and a sp3 content of 20-35%.

11. The electrode of claim 1, wherein the layer of a-C has a molar hydrogen content of 1% or less.

12. The electrode of claim 1, wherein the layer of a-C has an oxygen content of 1% or less.

13. The electrode of claim 1, wherein the layer of a-C has a thickness of 2 μm or less.

14. The electrode of claim 13, wherein the layer of a-C has a thickness of 1 μm or less.

15. The electrode of claim 1, wherein the coating is deposited by Filtered Cathodic Vacuum Arc.

16. The electrode of claim 1, wherein the $sp^2$ content of the coating as a whole is at least 55%.

17. A method of coating an electrode for electrochemical applications with a carbon-containing coating, the method comprising:
    a) depositing a first sub-layer comprising a-C,
    b) depositing a second sub-layer comprising a-C wherein the sp2 content of the first sub-layer is at least 3% greater than the sp2 content of the second sub-layer, and
    c) repeating the steps above to deposit at least 10 first sub-layers alternating with 10 second sub-layers,
    so as to produce the electrode of claim 1.

18. A method of coating an electrode for use in electrochemical applications with a carbon-containing coating, the method comprising:
    d) depositing a first sub-layer comprising a-C and having a sp2 content of 65-90% and a sp3 content of 10-35%,
    e) depositing a second sub-layer comprising a-C and having a sp2 content of 45-80% and a sp3 content of 20-55%, and
    f) repeating the steps above to deposit at least 10 first sub-layers alternating with 10 second sub-layers,
    wherein the sp2 content of the first sub-layers is at least 3% greater than the sp2 content of the second sub-layers, and
    wherein the sub-layers each have thicknesses in the range 0.3 to 5 nm.

19. The method of claim 18, comprising depositing at least 30 alternating first and second sub-layers.

20. The method of claim 18, for coating a bipolar plate, comprising:
    depositing the first sub-layers by Filtered Cathodic Vacuum Arc while applying a first biasing regimen to the bipolar plate; and
    depositing the second sub-layers by Filtered Cathodic Vacuum Arc while applying a second biasing regimen to the bipolar plate,
    wherein the second biasing regimen is adjusted compared to the first so as to result in sp2 content in the a-C being decreased by at least 3% and sp3 content in the a-C being increased by at least 3%.

21. The method of claim 20, wherein the biasing regimen comprises applying a biasing voltage according to a duty cycle, and the method comprises periodically adjusting the duty cycle, whereby adjusted duty cycle deposits the second-sub-layers having increased sp3 content and decreased sp2 content.

* * * * *

UNITED STATES PATENT AND TRADEMARK OFFICE
CERTIFICATE OF CORRECTION

| | | |
|---|---|---|
| PATENT NO. | : 11,898,257 B1 | Page 1 of 1 |
| APPLICATION NO. | : 18/264610 | |
| DATED | : February 13, 2024 | |
| INVENTOR(S) | : Tang et al. | |

It is certified that error appears in the above-identified patent and that said Letters Patent is hereby corrected as shown below:

On the Title Page

Column 1, item (72), in "Inventors", Line 2, delete "Singapore (SG);" and insert -- Shanghai (CN); --, therefor.

In the Claims

In Column 17, Claim 10, Line 56, before "The", delete "A".

Signed and Sealed this
Twenty-third Day of April, 2024

Katherine Kelly Vidal
*Director of the United States Patent and Trademark Office*